(12) United States Patent
Lee et al.

(10) Patent No.: US 6,542,317 B2
(45) Date of Patent: Apr. 1, 2003

(54) OPTICAL SYSTEM FOR CRYSTALLIZATION TOOL

(75) Inventors: Kag Hyeon Lee, Taejon (KR); Doh Hoon Kim, Taejon (KR); Sang Soo Choi, Taejon (KR); Hai Bin Chung, Taejon (KR); Dae Yong Kim, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 146 days.

(21) Appl. No.: 09/746,639

(22) Filed: Dec. 21, 2000

(65) Prior Publication Data

US 2001/0005286 A1 Jun. 28, 2001

(30) Foreign Application Priority Data

Dec. 24, 1999 (KR) .......................................... 1999-62273

(51) Int. Cl.$^7$ .............................. G02B 9/00; G02B 3/00; G03B 27/42
(52) U.S. Cl. ....................... 359/754; 359/650; 359/649; 355/53
(58) Field of Search ................................ 359/754, 650, 359/649, 766; 355/53, 67

(56) References Cited

U.S. PATENT DOCUMENTS

| 5,956,182 A | * | 9/1999 | Takahashi | .................... 359/649 |
| 5,968,383 A |   | 10/1999 | Yamazaki et al. | ..... 219/121.75 |
| 6,057,970 A | * | 5/2000 | Kim et al. | .................. 359/721 |

FOREIGN PATENT DOCUMENTS

JP          8-297244      *   4/1995

OTHER PUBLICATIONS

Robert S. Sposili and James S. Im, "Sequential lateral solidification of thin silicon films on SiO2", *Appl. Phys. Lett.* 69(19): 2864–2866, 1996.

H.J. Kim and James S. Im, "Multiple Pulse Irradiation Effects in Excimer Laser–Induced Crystallization of Amorphous SI Films", *Mat. Res. Symp. Proc. 321*: 665–670, 1994.

* cited by examiner

*Primary Examiner*—Georgia Epps
*Assistant Examiner*—Timothy J. Thompson
(74) *Attorney, Agent, or Firm*—Seed IP Law Group PLLC

(57) ABSTRACT

The present invention provides an optical system for crystallization tool for producing an crystallized silicon thin film by using an excimer laser as a light source to crystallize an amorphous silicon thin film through a fine stripped pattern, including 1st to 10th lenses sequentially arranged along an optical axis from said excimer laser, wherein the 1st lens having both side made convex; the 2nd lens having one side made convex toward the light source and the other side concave; the 3rd lens having one side made convex toward the light source and the other side concave; the 4th lens having both side concave; the 5th lens having both side made convex; the 6th lens having one side concave toward the light source and the other side made convex; the 7th lens having one side made convex toward the light source and the other side concave; the 8th lens having both side made convex; the 9th lens having one side made convex toward the light source and the other side concave; and the 10th lens having both side made convex.

4 Claims, 5 Drawing Sheets

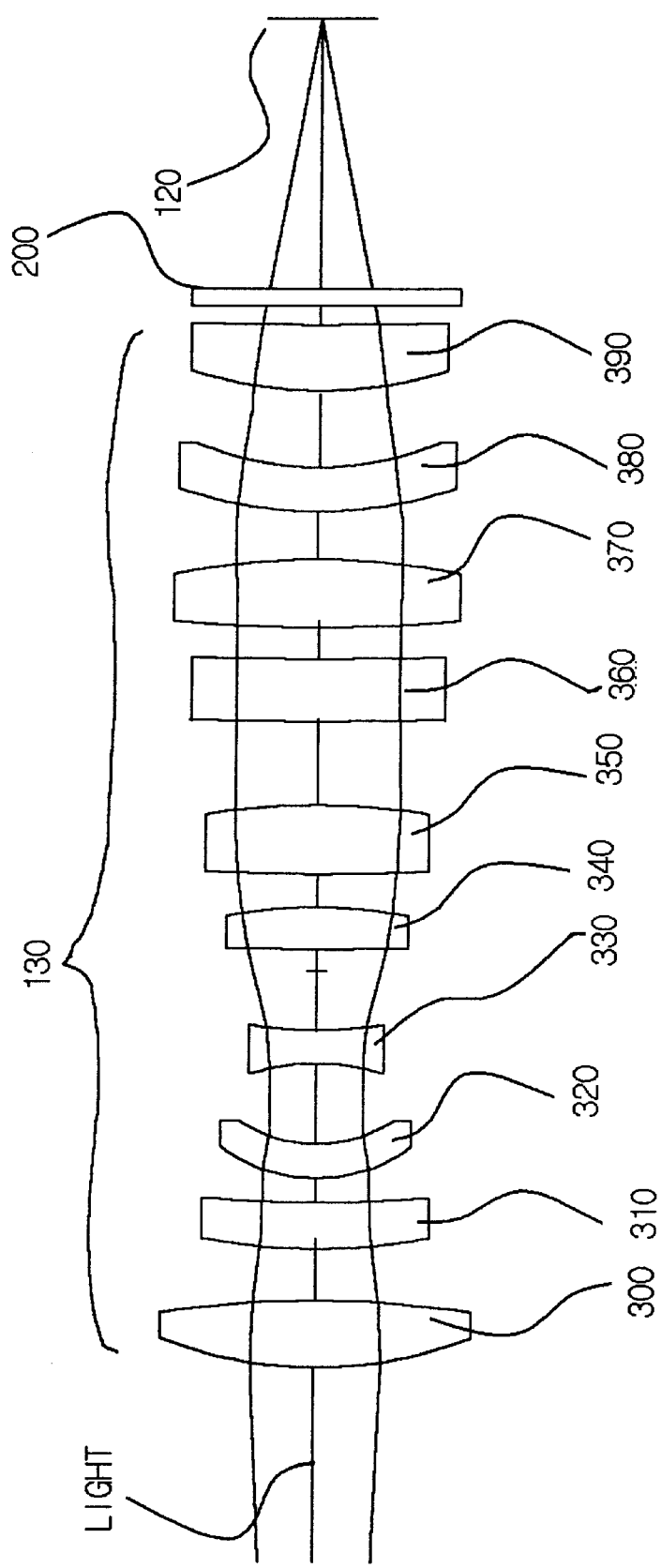

OPTICAL SYSTEM FOR CRYSTALLIZATION TOOL

TECHNICAL FIELD

The present invention relates to an optical system for crystallization tool, more particularly, to an optical system for crystallization tool for crystallizing an amorphous silicon thin film by using an excimer laser as an exposure light source through a fine-stripped pattern.

BACKGROUND OF THE INVENTION

The conventional optical system for crystallization tool using the excimer laser as a light source, so as to crystallize amorphous silicon thin film has been restrictively used at the small area LCD of high density, not at the large area LCD, because the grain size of the crystallized silicon thin film was small and irregular. By using the conventional simple optical system, a large pattern of the silicon thin film of which size was 1 mm×50 mm was exposed to the light to crystallize the silicon. In this case, crystallization was depending on a crystallization seed existed in any local area within a silicon layer that is temporarily melted, because of its large pattern. Therefore, there is a problem that the grain size of the crystallized silicon thin film is small and irregular.

SUMMARY OF THE INVENTION

Therefore, the present invention is made in order to solve the problem described above.

An object of the present invention is to provide an optical system for crystallization tool enabling fabrication of a large area LCD, in which the fine stripped pattern having 2 μm to 10 mm size is projected and exposed to the light by a projection optical system, and scanned gradually to grow the crystals, so that the grain size can be large and uniform.

The above object and other objects can be accomplished by an optical system for crystallization tool producing an crystallized silicon thin film by using an excimer laser as an exposure light source to crystallize an amorphous silicon thin film through a fine stripped pattern, comprising 1st to 10th lenses sequentially arranged along an optical axis from the excimer laser, the 1st lens having both side made convex; the 2nd lens having one side made convex toward the light source and the other side concave; the 3rd lens having one side made convex toward the light source and the other side concave; the 4th lens having both side concave; the 5th lens having both side made convex; the 6th lens having one side concave toward the light source and the other side made convex; the 7th lens having one side made convex toward the light source and the other side concave; the 8th lens having both side made convex; the 9th lens having one side made convex toward the light source and the other side concave; and the 10th lens having both side made convex.

BRIEF DESCRIPTION OF THE DRAWINGS

The embodiments of the present invention will be explained with reference to the accompanying drawings, in which:

FIGS. 2a and 2b are views illustrating how to control focusing of the optical system by using the optical parts comprising birefringence material in accordance with the present invention, wherein FIG. 2a is a view illustrating how to control focusing thereof and FIG. 2b is an enlarged view illustrating in detail the optical parts shown in FIG. 2a;

FIG. 3 is a detailed view of the optical system for crystallization tool using the excimer laser shown in FIG. 1.

DETAILED DESCRIPTION OF THE INVENTION

The above objects, other objects, features and advantages of the present invention will be better understood from the following description explained in conjunction with the attached drawings.

Figure 1:
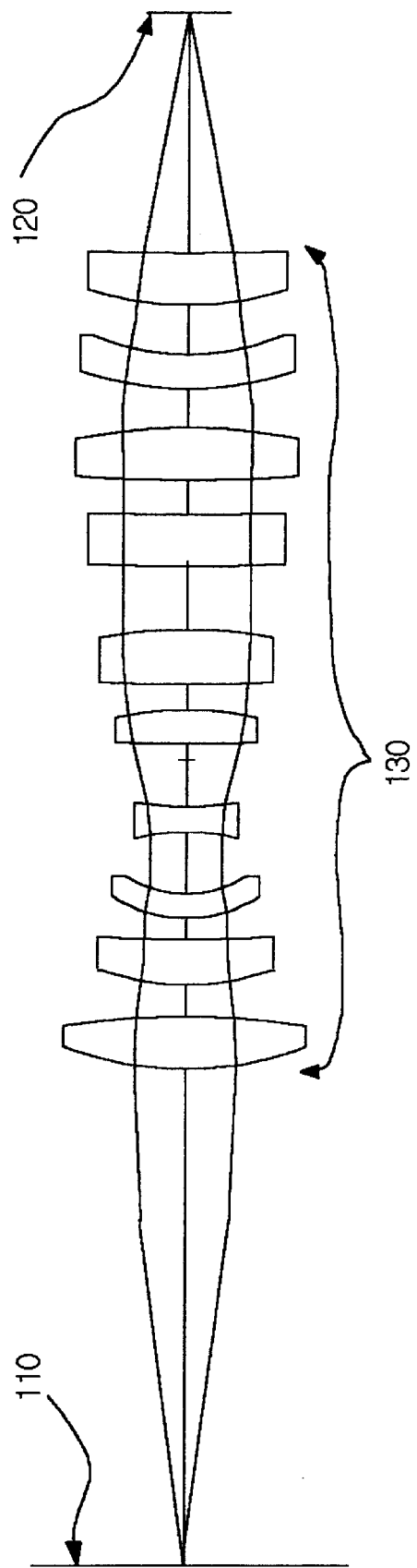
FIG. 1 is a schematic view showing an embodiment of an optical system for crystallization tool using an excimer laser in accordance with the present invention.

FIG. 1 is a schematic view showing an embodiment of an optical system for crystallization tool using an excimer laser in accordance with the present invention, wherein the optical system for crystallization tool includes ten lenses 130, the reference numeral 110 is a source light, the reference numeral 120 is a position of focus.

Figure 2A:
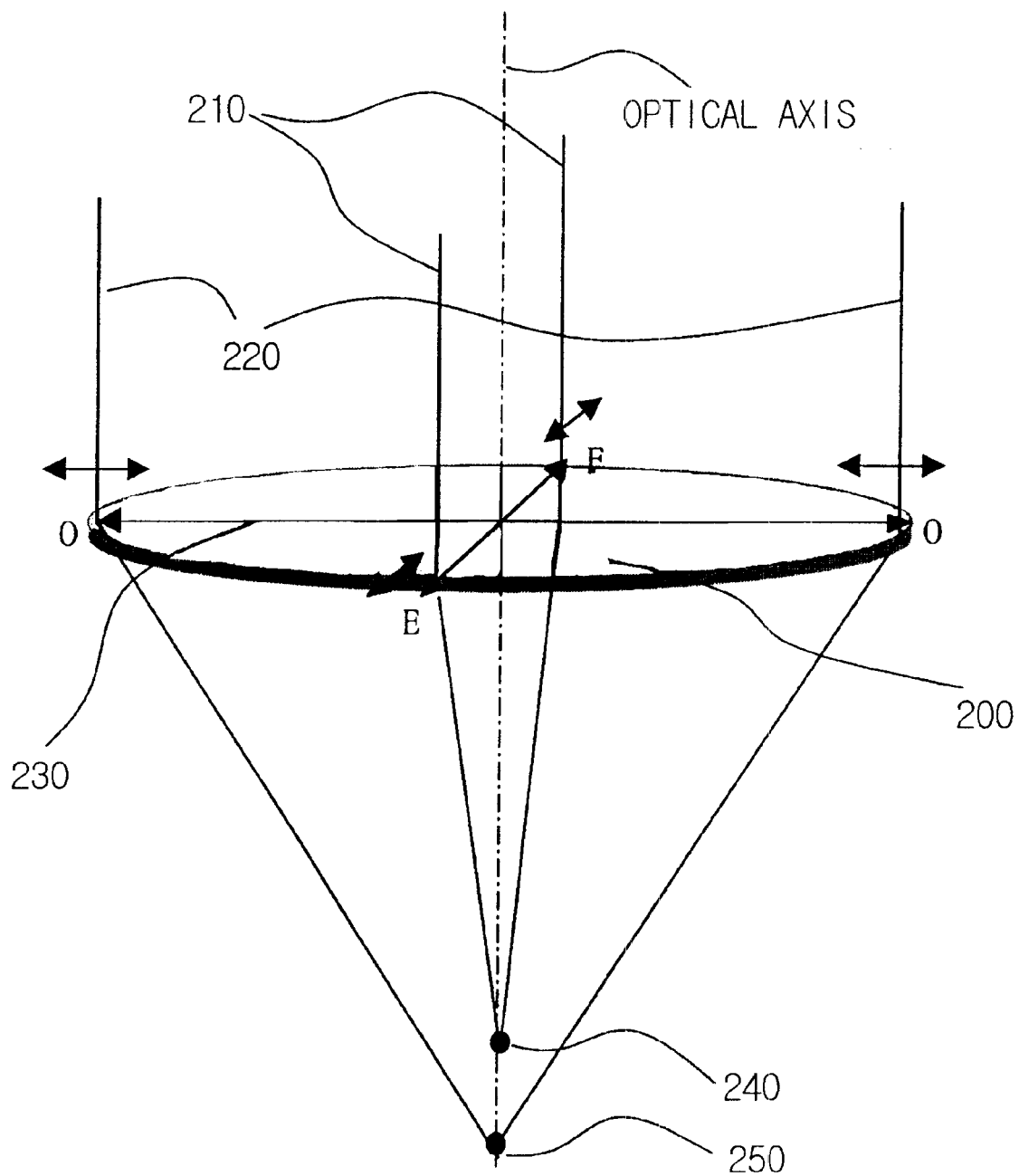
Figure 2B:
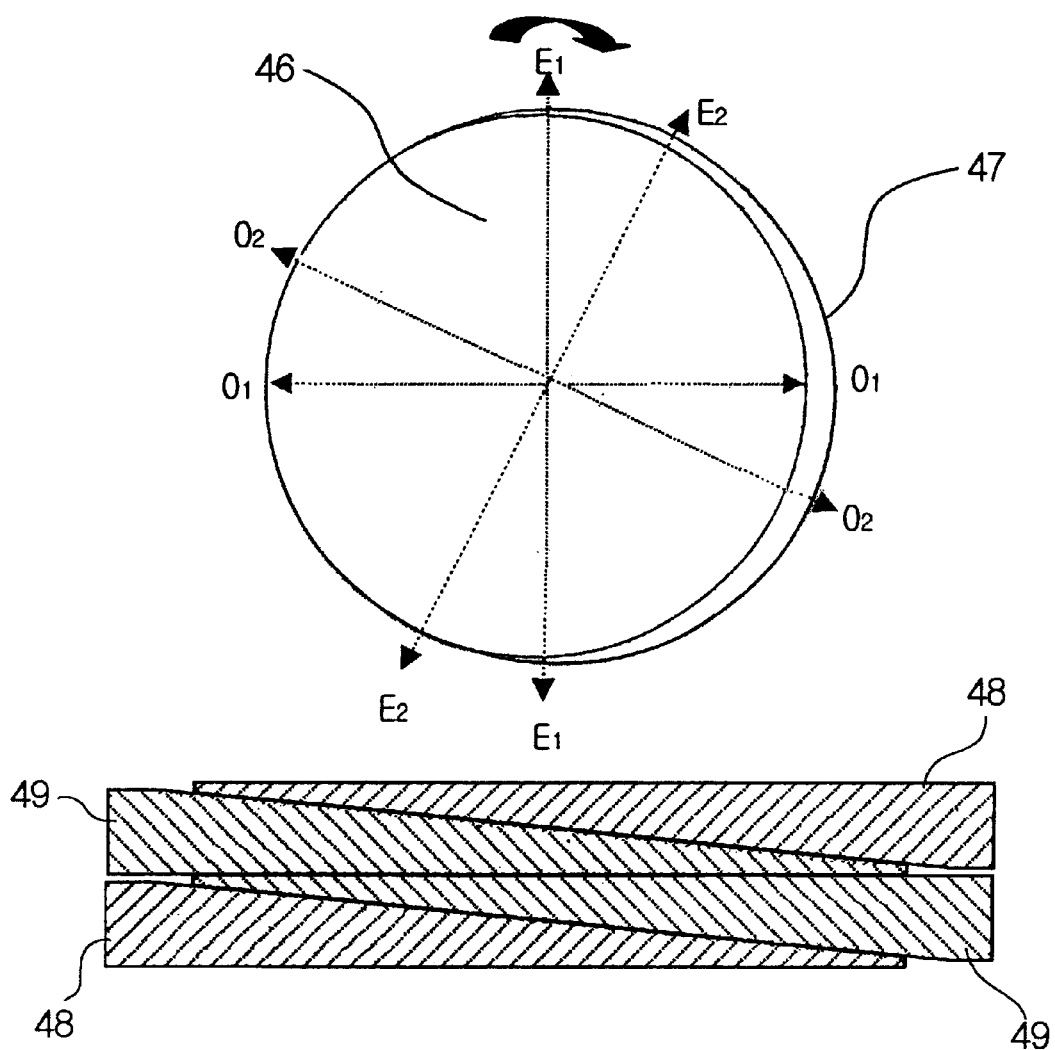

FIGS. 2a and 2b are views illustrating how to control focusing of the optical system by using the optical parts comprising birefringence material in accordance with the present invention, wherein FIG. 2a is a view illustrating how to control focusing thereof and FIG. 2b is an enlarged view illustrating in detail the optical parts shown in FIG. 2a.

To adjust a focus of the optical system, a projection type optical part such as a flat plate or an optical wedge made of birefringence material is equipped in the optical system and a light path is changed by using a difference of the index of refraction according to the polarized light component of the light, so that the position of focus can be varied in the direction of an optical axis of the optical system.

With reference to the FIG. 2a, a reference numeral 210 indicates a straight laser, a reference numeral 220 indicates the other laser having the polarized light in the direction perpendicular to the reference numeral 210, a reference numeral 200 indicates a optical part made of birefringence material, a reference numeral 230 indicates the optical axes of birefringence material including an O axis and an E axis, where O means ordinary and E means extraordinary, a reference numeral 240 indicates a position of an image by means of a straight polarized light perpendicular to the optical axis of birefringence material, and a reference numeral 250 indicates a position of an image by means of a straight polarized light parallel to the optical axis of the birefringence material.

When the optical parts 200 are made of birefringence material, the laser 210 has a straight polarized light of a direction parallel to the optical axis 230 of the birefringence material, the laser 220 has a straight polarized light of a direction perpendicular to the optical axis 230 of the birefringence material, and the index of refraction of the birefringence material are different according to axes thereof, so that the position of focus 240 determined by the laser 210 having a parallel straight polarized light and the position of focus 250 determined by the laser 220 having a perpendicular straight polarized light are set differently in accordance with the optical axis of the optical system. That is because of characteristics of the optical parts made of birefringence material.

Therefore, focusing is made within a predetermined range toward the light axis according to the polarized light component of the light by using the optical parts made of birefringence material as a constitution part of the optical system.

With reference to FIG. 2, a birefringence material optical part is made of two birefringence materials, so that the position of the focus can be varied by rotation of one birefringence material optical part about the light axis. Therefore, focus error due to thickness error of the silicon substrate is corrected to form an accurate focus on the substrate. Also, the equal effect can be obtained by forming the birefringence material optical parts 48, 49 in the form of wedge to control the thickness.

FIG. 3 is a detailed view of the optical system for crystallization tool using the excimer laser shown in FIG. 1, in which XeCl excimer laser (wave length: 308 nm) is used as a light source, a reduction ratio is 1/4, the numerical aperture (N.A.) is 0.15, the exposure light area is 10×10 mm$^2$, the resolution is 2 μm so that a fine stripped pattern of 2 μm(space 8 μm)×10 mm can be resolved. Also, birefringence material are used as optical parts to form an accurate focus on the substrate and a fused silica and a CaF2 are used as optical materials to solve a problem of chromatic aberration.

The optical system in accordance with an embodiment of the present invention is composed of total ten lenses. The 1st lens 340 having both side made convex, the 2nd lens 310 having one side made convex and the other side concave, the 3rd lens 320 having one side made convex and the other side concave, the 4th lens 330 having both side concave, the 6th lens 350 having one side concave and the other side made convex, said 7th lens 360 having one side made convex and the other side concave, the 9th lens 380 having one side made convex and the other side concave, and the 10th lens 390 having both side made convex are made of fused silica and the 5th lens 340 having both side made convex and the 8th lens 370 having both side made convex are made of CaF$_2$. Also, an optical part 200 used in end of the optical system for focusing is made of birefringence material.

A mask and the illumination system uniformly distributing light emitted from the light source of XeCl excimer laser are located in front of the optical system 130 and a silicon substrate 120 is located in rear of the optical system 130.

Because the 5th lens 340 having both side made convex and the 8th lens 370 having both side made convex are made of CaF2, the chromatic aberration of the excimer laser is disappeared to improve efficiency of the light intensity, and a position of focus can be controlled by using optical parts made of birefringence material.

Detailed standards of the ten lenses in accordance with the present invention will be shown in the following table 1. However, it is not limited only to the following table 1.

TABLE 1

| Distinction | Lens | face | radius of curvature (mm) | thickness (mm) | optical member (index of refraction) | gap (mm) |
|---|---|---|---|---|---|---|
| face of object (mask face: 1) | | | infinity | | | 245.715.000 |
| group of lenses (3) | 1st lens (30) | 1 | 85.799 | 11.0 | 1.485636 | |
| | | 2 | −110.89 | | | 10.846 |
| | 2nd lens (31) | 3 | 26.834 | 6.734 | 1.485636 | |
| | | 4 | 68.552 | | | 4.8 |
| | 3rd lens (32) | 5 | 75.992 | 5.3 | 1.485636 | |
| | | 6 | 218.582 | | | 8.2 |
| | 4th lens (33) | 7 | 372.350 | 5.5 | 1.485636 | |
| | | 8 | 174.384 | | | 7.416 |
| | STOP | | infinity | | | 3.5 |
| | 5th lens (34) | 10 | 208.319 | 7.638 | 1.45255 | |
| | | 11 | −37.152 | | | 4.5 |
| | 6th lens (35) | 12 | −251.996 | 10.211 | 1.485636 | |
| | | 13 | −89.060 | | | 3.48 |
| | 7th lens (36) | 14 | 199.670 | 7.204 | 1.485636 | |
| | | 15 | 112.403 | | | 7.1 |
| | 8th lens (37) | 16 | 221.853 | 12.0 | 1.45255 | |
| | | 17 | −49.260 | | | 4.628 |
| | 9th lens (38) | 18 | 54.214 | 6.427 | 1.485636 | |
| | | 19 | 33.673 | | | 15.799 |
| | 10th lens (39) | 20 | 44.257 | 12.0 | 1.485636 | |
| | | 21 | −227.281 | | | |
| top face (substrate: 2) | | | | | | |

Figure 4:
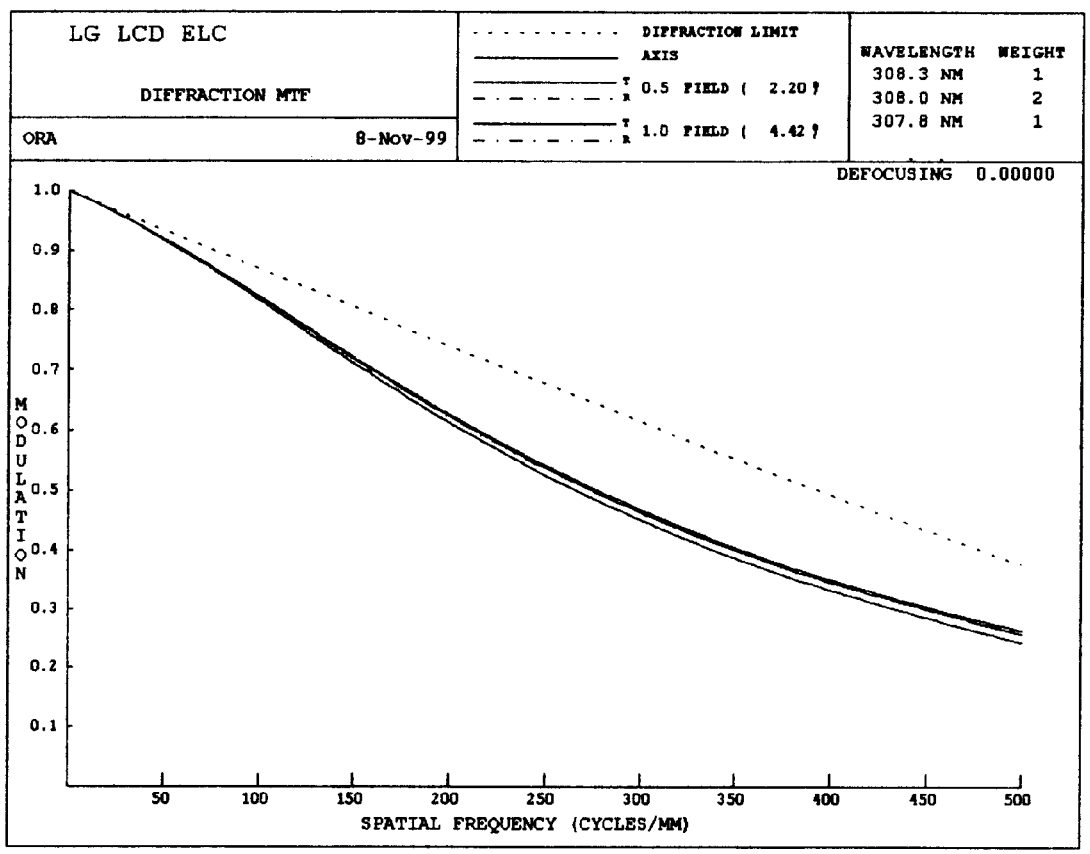
FIG. 4 is a view showing a performance value (MTF value) according to each space frequency of the optical system shown in FIG. 3.

FIG. 4 is a view showing a performance value (MTF value) according to each space frequency of the optical system shown in FIG. 3, in which the center (0.0 field) of an object up to space frequency 500 cycles/mm, 0.5 position of front visibility, and MTF values of a tangential top face and a sagittal top face to the front visibility (1.0 field) is shown, respectively. As shown in FIG. 4, the optical system according to the present invention can expose the whole surface of the substrate to the light with a uniform resolution, and in this case the solution can be up to 2 μm.

As explained above in detail, according to the present invention in which an excimer laser used as a light source to crystallize an amorphous silicon thin film, as compared with the conventional optical system, the grain size is large and uniform. That is, the resolution of the optical system for crystallization tool can be improved to expose the fine stripped pattern having 2 μm width to the light, and TFT devices of a large area and a good quality can be fabricated from the silicon thin film on the SiO$_2$ by uniform crystallization of a large grain, so that a large area of LCD can be produced.

Although technical spirits of the present invention has been disclosed with reference to the appended drawings and the preferred embodiments of the present invention corresponding to the drawings has been described, descriptions in the present specification are only for illustrative purpose, not for limiting the present invention.

Also, those who are skilled in the art will appreciate that various modifications, additions and substitutions are possible without departing from the scope and spirit of the present invention. Therefore, it should be understood that the present invention is not limited only to the accompanying claims and the equivalents thereof, and includes the aforementioned modifications, additions and substitutions.

What we claim:

1. An optical system for a crystallization tool for producing a crystallized silicon thin film by using an excimer laser as an exposure light source to crystallize an amorphous silicon thin film through a fine stripped pattern, comprising 1st to 10th lenses sequentially arranged along an optical axis from said excimer laser, including an optical part having birefringence material to control a depth of focus of the light passing through said 10th lens, said 1st lens having both sides made convex;

said 2nd lens having one side made convex toward said light source and the other side concave;

said 3rd lens having one side made convex toward said light source and the other side concave;

said 4th lens having both sides concave;

said 5th lens having both sides made convex;

said 6th lens having one side concave toward said light source and the other side made convex;

said 7th lens having one side made convex toward said light source and the other side concave;

said 8th lens having both sides made convex;

said 9th lens having one side made convex toward said light source and the other side concave; and said 10th lens having both sides made convex, wherein said optical part includes two birefringence material, each having a polarized light component perpendicular to each other.

2. The optical system for a crystallization tool according to claim 1, wherein said two birefringence material of said optical part are in contact with each other in parallel.

3. The optical system for a crystallization tool according to claim 1, wherein said two birefringence of said optical part are in contact with each other in the form of a taper.

4. The optical system for crystallization tool according to claim 1, in said 1st lens, a thickness thereof is 10.9 mm to 11.1 mm, an optical refraction member thereof is a fused silica, a radius of curvature of the surface toward said light source thereof is 85.78 mm to 85.81 mm, and a radius of curvature of the opposite surface thereof is −110.90 mm to −110.88 mm;

in said 2nd lens, a thickness thereof is 6.6 mm to 6.8 mm, an optical refraction member thereof is a fused silica, a radius of curvature of a surface toward said light source thereof is 26.82 mm to 26.84 mm, and a radius of curvature of the opposite surface thereof is 68.54 mm to 68.56 mm;

in said 3rd lens, a thickness thereof is 5.2 mm to 5.4 mm, an optical refraction member thereof is a fused silica, a radius of curvature of a surface toward said light source thereof is 75.98 mm to 76.00 mm, and a radius of curvature of the opposite surface thereof is 218.57 mm to 218.59 mm;

in said 4th lens, a thickness thereof is 5.4 mm to 5.6 mm, an optical refraction member thereof is a fused silica, a radius of curvature of a surface toward said light source thereof is 372.34 mm to 372.36 mm, a radius of curvature of the opposite surface thereof is 174.37 mm to 174.39 mm;

in said 5th lens, a thickness thereof is 7.5 mm to 7.7 mm, an optical refraction member thereof is $CaF_2$, a radius of curvature of a surface toward said light source thereof is 208.30 mm to 208.32 mm, a radius of curvature of the opposite surface thereof is −37.16 to −37.14 mm;

in said 6th lens, a thickness thereof is 10.1 mm to 10.3 mm, an optical refraction member thereof is a fused silica, a radius of curvature of a surface toward said light source thereof is −252.00 mm to −251.98 mm, a radius of curvature of the opposite surface thereof is −89.07 mm to −89.05 mm;

in said 7th lens, a thickness thereof is 7.1 mm to 7.3 mm, an optical refraction member thereof is a fused silica, a radius of curvature of a surface toward said light source thereof is 199.66 mm to 199.68 mm, a radius of curvature of the opposite surface thereof is 112.39 mm to 112.41 mm;

in said 8th lens, a thickness thereof is 11.9 mm to 12.1 mm, an optical refraction member thereof is $CaF_2$, a radius of curvature of a surface toward said light source thereof is 221.84 mm to 221.86 mm, a radius of curvature of the opposite surface thereof is −49.27 mm to −49.25 mm;

in said 9th lens, a thickness thereof is 6.3 mm to 6.5 mm, an optical refraction member thereof is a fused silica, a radius of curvature of a surface toward said light source thereof is 54.20 mm to 54.22 mm, a radius of curvature of the opposite surface thereof is 33.66 mm to 33.68 mm; and in said 10th lens, a thickness thereof is 11.9 mm to 12.1 mm, an optical refraction member thereof is fused silica, a radius of curvature of a surface toward said light source thereof is 44.24 mm to 44.26 mm, a radius of curvature of the opposite surface thereof is −227.29 mm to −227.27 mm.

* * * * *